United States Patent
Leobandung

(10) Patent No.: US 11,424,235 B2
(45) Date of Patent: Aug. 23, 2022

(54) INTERPOSER-LESS MULTI-CHIP MODULE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/925,133

(22) Filed: Jul. 9, 2020

(65) Prior Publication Data

US 2022/0013519 A1    Jan. 13, 2022

(51) Int. Cl.
| | | |
|---|---|---|
| *H01L 25/00* | (2006.01) | |
| *H01L 25/18* | (2006.01) | |
| *H01L 25/065* | (2006.01) | |
| *H01L 23/00* | (2006.01) | |

(52) U.S. Cl.
CPC .............. *H01L 25/50* (2013.01); *H01L 24/73* (2013.01); *H01L 24/83* (2013.01); *H01L 24/92* (2013.01); *H01L 24/96* (2013.01); *H01L 25/0655* (2013.01); *H01L 25/18* (2013.01); *H01L 2224/73267* (2013.01); *H01L 2224/83862* (2013.01); *H01L 2224/92244* (2013.01)

(58) Field of Classification Search
CPC ..... H01L 25/0753; H01L 24/83; H01L 24/73; H01L 25/50; H01L 25/18; H01L 24/96; H01L 2224/83862; H01L 2224/73267
See application file for complete search history.

(56) References Cited

U.S. PATENT DOCUMENTS

| | | |
|---|---|---|
| 6,727,576 B2 | 4/2004 | Hedler et al. |
| 6,975,016 B2 | 12/2005 | Kellar et al. |
| 9,000,584 B2 | 4/2015 | Lin et al. |
| 9,548,240 B2 | 1/2017 | Lin et al. |
| 9,666,560 B1 | 5/2017 | Wang et al. |
| 9,935,090 B2 | 4/2018 | Yu et al. |
| 10,049,953 B2 | 8/2018 | Yu et al. |

(Continued)

FOREIGN PATENT DOCUMENTS

| | | | |
|---|---|---|---|
| CN | 202818243 U | * | 3/2013 |
| CN | 103137613 A | | 6/2013 |
| CN | 106840469 A | | 6/2017 |

OTHER PUBLICATIONS

John H. Lau, "Recent Advances and New Trends in Semiconductor Packaging," IEEE/CMPT Society Lecture in the Santa Clara Valley, Apr. 2016, 49 pp.

(Continued)

*Primary Examiner* — Jasmine J Clark
(74) *Attorney, Agent, or Firm* — Robert Sullivan; Michael J. Chang, LLC

(57) ABSTRACT

Interposer-less multi-chip module are provided. In one aspect, an interposer-less multi-chip module includes: a substrate; a base film disposed on the substrate; and chips pressed into the base film, wherein top surfaces of the chips are coplanar. For instance, the chips can have varying thicknesses and are pressed into the base film to different depths such that top surfaces of the chips are coplanar. An interconnect layer having back-end-of line (BEOL) metal wiring can be present on the wafer over the chips. Methods of forming an interposer-less multi-chip module are also provided.

23 Claims, 8 Drawing Sheets

(56) References Cited

U.S. PATENT DOCUMENTS

| | | |
|---|---|---|
| 10,269,767 B2 | 4/2019 | Chen et al. |
| 2012/0058579 A1* | 3/2012 | Horng .................... H01L 33/60 |
| | | 438/27 |
| 2013/0092310 A1 | 4/2013 | Ishigami et al. |
| 2014/0167808 A1 | 6/2014 | Bartley et al. |

OTHER PUBLICATIONS

John H. Lau, "Recent Advances and Trends in Fan-Out Wafer/Panel-Level Packaging." Journal of Electronic Packaging, vol. 141, No. 4, Dec. 2019, 040801, 27 pp.

John H. Lau et al., "Fan-out wafer-level packaging for heterogeneous integration," IEEE Transactions on Components, Packaging and Manufacturing Technology, vol. 8, No. 9, Sep. 2018, pp. 1544-1560.

International Search Report and Written Opinion for PCT/IB2021/056039 dated Oct. 12, 2021 (10 pages).

\* cited by examiner

INTERPOSER-LESS MULTI-CHIP MODULE

FIELD OF THE INVENTION

The present invention relates to multi-chip module technology, and more particularly, to interposer-less multi-chip modules and techniques for processing thereof.

BACKGROUND OF THE INVENTION

In integrated circuit (IC) packaging designs, silicon (Si) interposers are often inserted between chips and the package substrate. These Si interposers connect the chips one to another and/or to the underlying package substrate. The use of Si interposers is a leading process to provide high performance integration of heterogenous IC components.

However, a notable drawback to the implementation of a Si interposer is cost. Namely, a through silicon via (TSV) process is often employed in the fabrication of Si interposers, which increases fabrication complexity and drives up production costs. Further, the use of a Si interposer requires multiple bonding steps. For instance, individual chips, multiple chip modules, etc. are first mounted to the Si interposer. The Si interposer then has to be bonded to the package substrate. These multiple bonding steps again increase fabrication complexity and drive up production costs.

Therefore, improved interposer designs and techniques for use thereof would be desirable.

SUMMARY OF THE INVENTION

The present invention provides interposer-less multi-chip modules and techniques for processing thereof. In one aspect of the invention, an interposer-less multi-chip module is provided. The interposer-less multi-chip module includes: a substrate; a base film disposed on the substrate; and chips pressed into the base film, wherein top surfaces of the chips are coplanar.

In another aspect of the invention, another interposer-less multi-chip module is provided. The interposer-less multi-chip module includes: a substrate; a base film disposed on the substrate; chips pressed into the base film, wherein the chips have varying thicknesses, and wherein the chips are pressed into the base film to different depths such that top surfaces of the chips are coplanar; and an interconnect layer present on the wafer over the chips, wherein the interconnect layer includes back-end-of line (BEOL) metal wiring.

In yet another aspect of the invention, a method of forming an interposer-less multi-chip module is provided. The method includes: depositing a base film onto a substrate; placing chips on the substrate over the base film; pressing the chips into the base film using a presser such that top surfaces of the chips are coplanar; and curing the base film to cross-link the base film.

In still yet another aspect of the invention, another method of forming an interposer-less multi-chip module is provided. The method includes: depositing a base film onto a substrate; placing chips on the substrate over the base film, wherein the chips have varying thicknesses; pressing the chips into the base film using a presser, wherein the presser presses the chips having the varying thickness into the base film to different depths such that top surfaces of the chips are coplanar; curing the base film; and forming an interconnect layer on the wafer over the chips, wherein the interconnect layer includes BEOL metal wiring.

A more complete understanding of the present invention, as well as further features and advantages of the present invention, will be obtained by reference to the following detailed description and drawings.

DETAILED DESCRIPTION OF PREFERRED EMBODIMENTS

As provided above, conventional silicon (Si) interposer technology typically involves the use of a through silicon via (TSV) process and multiple bonding steps (i.e., chips and/or chip modules to interposer, and then interposer to package substrate). Both of these factors increase fabrication complexity and drive up production costs.

Advantageously, provided herein are new multi-chip module designs that eliminate the need for an interposer altogether (also referred to herein as an 'interposer-less multi-chip module'). Thus, with the present interposer-less multi-chip module design, TSVs and the need for multiple bonding steps are eliminated, thereby simplifying the overall IC integration. Simplifying the integration process, reduces the overall fabrication complexity and hence lowers the production costs.

As will be described in detail below, one challenge to implementing the present interposer-less multi-chip module design is that the chips can vary in thickness. Thus, when deposited onto a substrate of the module, the chips would produce a non-planar surface having an uneven topography which proves difficult for subsequent metallization processes to be performed. However, it has been found herein that if a pliable base film such as spin-on-glass, an epoxy and/or polyimide, is first deposited onto the substrate, then a presser device can be used to level out the chips and thereby forming a planar surface for metallization. Namely, by way of this process, the pliable base film is used to accommodate the thickness differences amongst the chips, whereby the thicker chips get pressed into the base film a greater amount than the thinner chips and vice versa.

Figure 1:
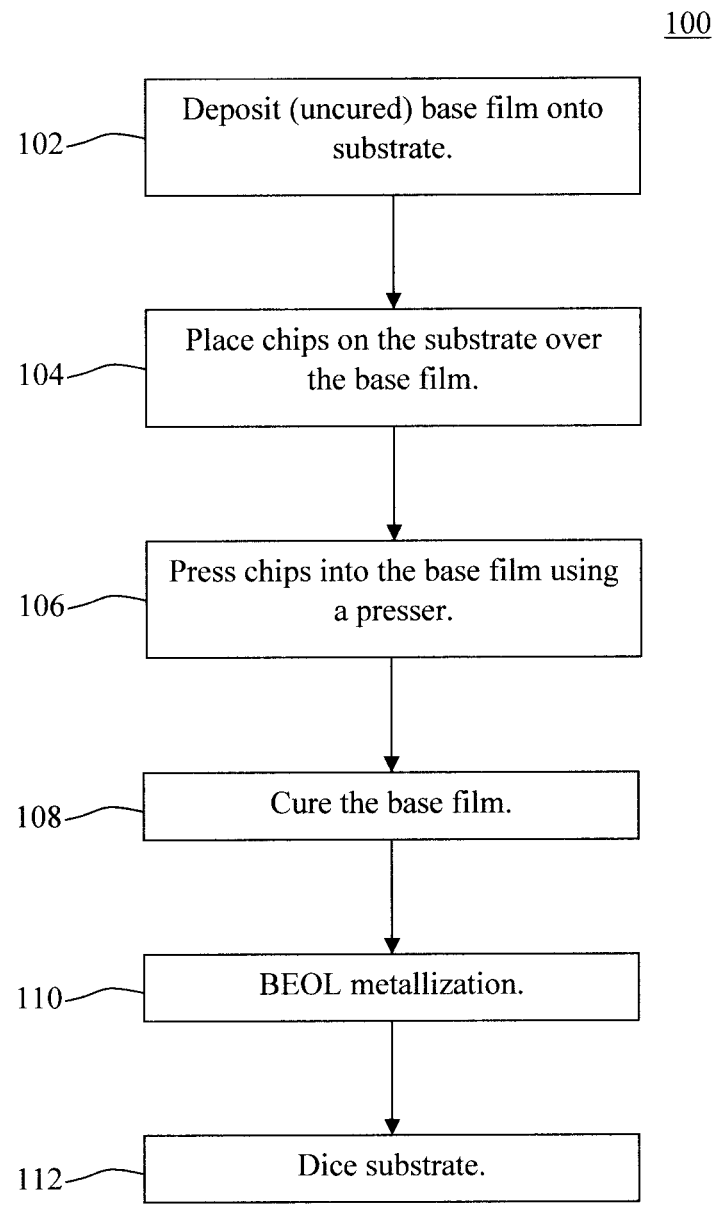
FIG. 1 is a diagram illustrating an exemplary methodology for forming an interposer-less multi-chip module according to an embodiment of the present invention.

An overview of the present techniques is now provided by way of reference to methodology 100 of FIG. 1. In step 102, an (uncured) base film is deposited onto a substrate. According to an exemplary embodiment, the substrate is a semiconductor wafer such as a silicon (Si) wafer. Alternatively, the substrate can be formed from other materials such as silicon dioxide ($SiO_2$), a polymer laminate, etc. A casting process such as spin-coating or spray coating can be employed to uniformly deposit the base film onto the substrate. According to an exemplary embodiment, the base film is deposited on the substrate to a thickness of from about 5 micrometers ($\mu m$) to about 20 $\mu m$ and ranges therebetween.

In general, the base film includes a material that is pliable to accommodate thickness variations amongst the chips. By 'pliable' it is meant that the uncured base film can change its shape when pressure is applied to it. Thus, when chips of varying thicknesses are pressed into the base film (see below), the thicker chips can be pressed further into the base film thereby leveling their heights. Another requirement of the base film is that it has a coefficient of thermal expansion (CTE) similar to both the chips and the substrate. Thus, when the base film and the substrate are later heated to cure the base film, the base film does not impart strain onto either the chips or the substrate. According to an exemplary embodiment, a CTE difference of less than or equal to about 3 times (3×), e.g., from about 2× to about 3×) is considered to be 'similar.' By way of example only, suitable materials for the base film include, but are not limited to, spin-on-glass and/or a doped polymer. For instance, spin-on-glass includes silicon dioxide ($SiO_2$) (and optional dopants) dispersed within a solvent. Following deposition, an anneal is performed to drive off the solvent and cure the spin-on-glass.

In step 104, chips are placed on the substrate over the base film. As will be described in detail below, the chips preferably contain upward facing metal landing pads for connection to the back-end-of-line (BEOL) wiring that will be formed later on in the process (see below). Notably, some variation in the thickness of the chips placed on the substrate is expected. Thus, the as-placed chips will produce a non-planar surface on top of the substrate. A non-planar surface is undesirable for subsequent BEOL processing.

Thus, in step 106, a presser device is employed to physically press the chips into the compressible base film. The presser device includes a planar surface at the interface with the chips that spans multiple chips (e.g., the presser spans all of the chips). Since this planar surface applies force across the tops of the multiple chips, the thicker chips will be pressed further into the base film than the thinner chips. Namely, force is applied at least until the planar surface of the presser device contacts the top of the thinnest chip. However, at that point the pressing can be continued to sink the thinnest chip further into the base film, if so desired. The result is the creation of a planar surface across the tops of the chips. Naturally, this requires that the chips are pressed different depths into the base film. Namely, a thicker chip will be pressed to a greater depth in the base film than a thinner chip.

In step 108, the base film is cured. Curing will crosslink the base film, thereby setting the positioning of the chips on the substrate (including the planar surface that has been created across the tops of the chips by the presser). By way of example only, the curing is performed by annealing the base film at a temperature of from about 100° C. to about 500° C. and ranges therebetween, for a duration of from about 1 hour to about 5 hours and ranges therebetween.

In step 110, metallization techniques are employed to form BEOL metal wiring and solder bumps on the Si wafer over the chips. The BEOL metal wiring contacts the metal landing pads on the tops of the chips, and also provides bridge connections between chips. As will be described in detail below, this BEOL metallization can involve depositing dielectric onto the substrate over the chips (which now have top surfaces that are coplanar), and forming metal lines in the dielectric. The dielectric with metal lines may also be referred to herein as an 'interconnect layer.' A controlled collapse chip connection (C4) process can be employed to form solder bumps on the interconnect layer in contact with the metal wiring. The resulting structure, i.e., substrate with chips set at different depths in the (cured) base film and BEOL metal wiring over the chips, is what is referred to herein as an interposer-less multi-chip module.

In step 112, the substrate can then be diced into multiple segments, each segment containing at least two of the chips. Standard wafer dicing techniques can be employed. Each segment individually serves as an interposer-less multi-chip module for the chips that it contains.

Figure 2:
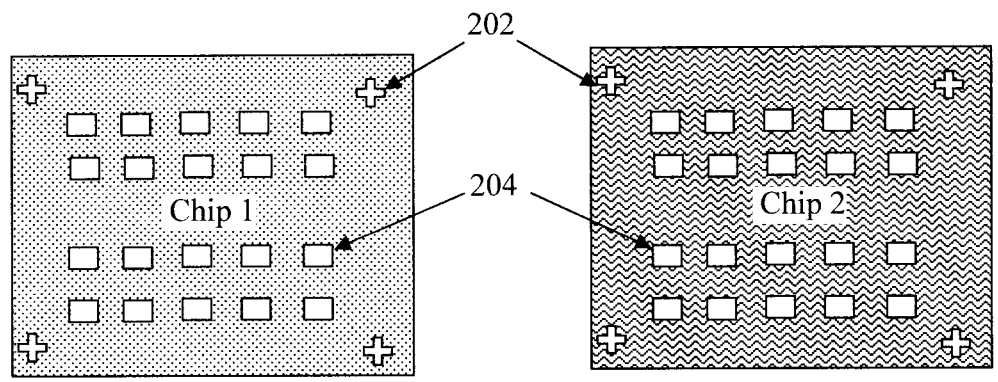
FIG. 2 is a top-down diagram illustrating chips having metal landing pads for integration on the present interposer-less multi-chip module according to an embodiment of the present invention.

Given the above overview in methodology 100, an exemplary implementation of the present techniques for forming an interposer-less multi-chip module is now described by way of reference to FIGS. 2-14. As shown in FIG. 2, the present interposer-less multi-chip module permits the heterogenous integration of different types (e.g., memory, logic, etc.) of chips (here labeled 'Chip 1' and 'Chip 2') of varying dimensions including varying thicknesses (see below). For ease and clarity of depiction, two chip types are illustrated in the present example. However, it is to be understood that the present techniques can be implemented with more or fewer chip types than shown, including scenarios where only a single type of chip is being employed. Further, Chip 1 and Chip 2 generically represent anything from a single chip to multiple chips within a common package (along with any associated components such as resistors, capacitors, etc.).

As shown in FIG. 2, the chips (Chip 1 and Chip 2) can have alignment marks 202 thereon. In this particular example, the alignment marks 202 are placed in the corners of the chips. By way of example only, the alignment marks 202 can be formed on Chip 1 and Chip 2 using standard photolithography and etching processes. As will be described in detail below, alignment marks 202 will be used during placement of the chips on the substrate using corresponding alignment marks on the substrate.

As also shown in FIG. 2, the chips (Chip 1 and Chip 2) each have multiple upward facing metal landing pads 204 on a top surface thereof. As will be described in detail below, these metal landing pads 204 will be used to connect the chips to the interconnect layer that will be formed later on in the process. The metal landing pads 204 can be formed using a so-called 'damascene' or 'dual damascene' process, whereby a feature (damascene process) or a combination of features (dual damascene process) such as a trench and/or a via are first patterned in a dielectric. The feature(s) are then filled with a contact metal such as copper (Cu), cobalt (Co), ruthenium (Ru) and/or tungsten (W). A process such as evaporation, sputtering or electrochemical plating can be employed to deposit the contact metal into the features. Prior to depositing the contact metal, the feature(s) can be lined with a diffusion barrier layer (not shown). Suitable materials for the diffusion barrier layer include, but are not limited to, titanium (Ti), tantalum (Ta), titanium nitride (TiN) and/or tantalum nitride (TaN).

Figure 3:
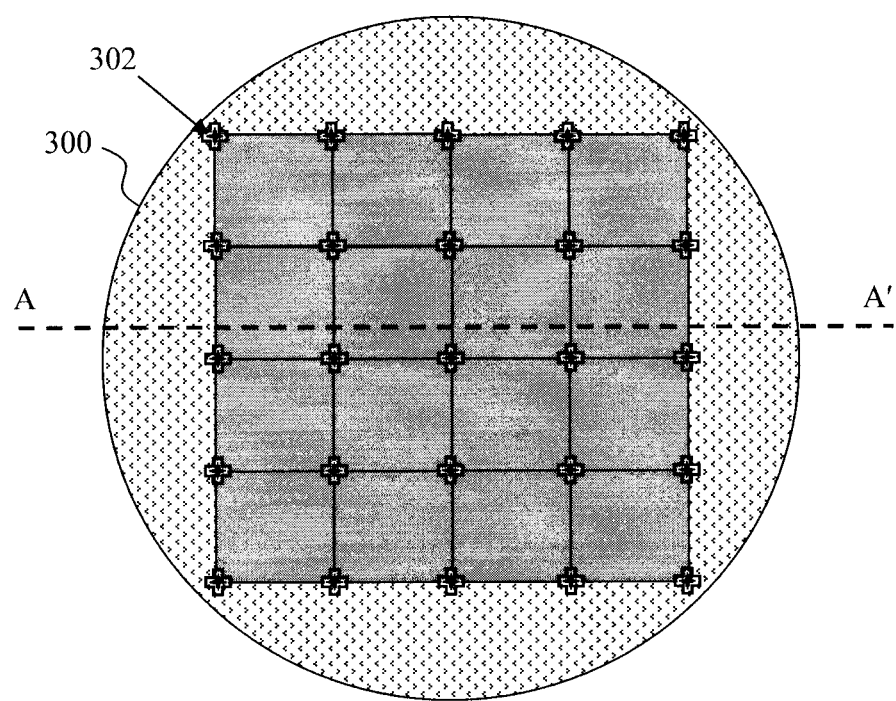
FIG. 3 is a top-down diagram illustrating an exemplary substrate having alignment marks for the chips according to an embodiment of the present invention.

A substrate 300 is then provided. See FIG. 3. According to an exemplary embodiment, substrate 300 is a semiconductor wafer such as a bulk Si or silicon-on-insulator (SOI) wafer. Alternatively, the substrate can be formed from other materials such as silicon dioxide ($SiO_2$), a polymer laminate, etc. A SOI wafer includes an SOI layer separated from an underlying substrate by a buried insulator. When the buried insulator is an oxide it is referred to herein as a buried oxide or BOX. As shown in FIG. 3, alignment marks 302 are present on the substrate 300. As highlighted above, these alignment marks 302 correspond to the alignment marks 202 on the chips. Thus, when the chips are placed on the substrate 300, proper positioning can be achieved by aligning the alignment marks 202 on the chips with the alignment marks 302 on the substrate 300. By way of example only, the alignment marks 302 can be formed on substrate 300 using standard photolithography and etching processes.

Figure 4:
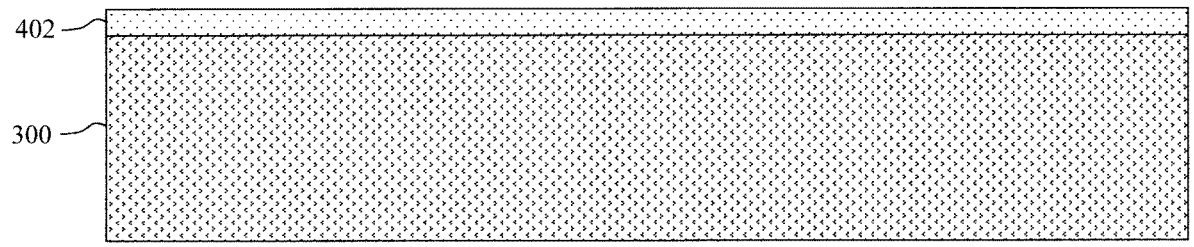
FIG. 4 is a cross-sectional diagram illustrating an (uncured) base film having been deposited onto the substrate according to an embodiment of the present invention.

Next, an (uncured) base film 402 is deposited onto the substrate 300. See FIG. 4. FIG. 4 provides a cross-sectional view through substrate 300 along line A-A' (see FIG. 3). Generally, the base film 402 can include any material that can accommodate thickness variations amongst the chips when the chips are pressed into the base film 402. Another requirement of the base film is that it has a coefficient of thermal expansion (CTE) similar to the CTE of the substrate 300 and the chips. Thus, when the base film 402 and substrate 300 are later heated to cure the base film 402, no strain is imparted onto the substrate 300 or the chips. Suitable materials for the base film that meet these requirements include, but are not limited to, spin-on-glass and/or a doped polymer.

As provided above, a casting process such as spin-coating or spray coating can be employed to uniformly deposit the base film 402 onto the substrate 300. According to an exemplary embodiment, the base film 402 has a thickness of from about 5 µm to about 20 µm and ranges therebetween.

Figure 5:
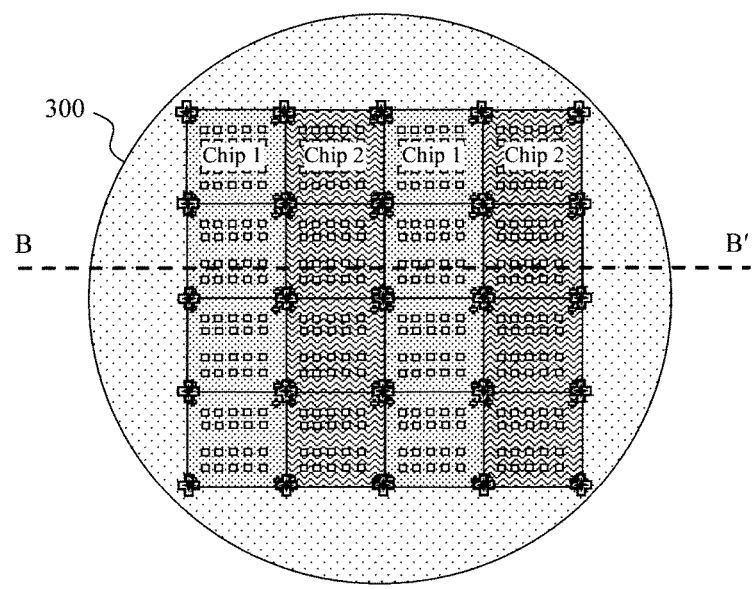
FIG. 5 is a top-down diagram illustrating the chips having been placed on the substrate over the base film according to an embodiment of the present invention.

As shown in FIG. 5, the chips (Chip 1 and Chip 2) are then placed on the substrate 300 over the base film 402. According to an exemplary embodiment, the chips are placed on the substrate 300 using a pick and place machine. As highlighted above, this placement is guided by the alignment marks 202 on the chips and the corresponding alignment marks 302 on the substrate 300.

Figure 6:
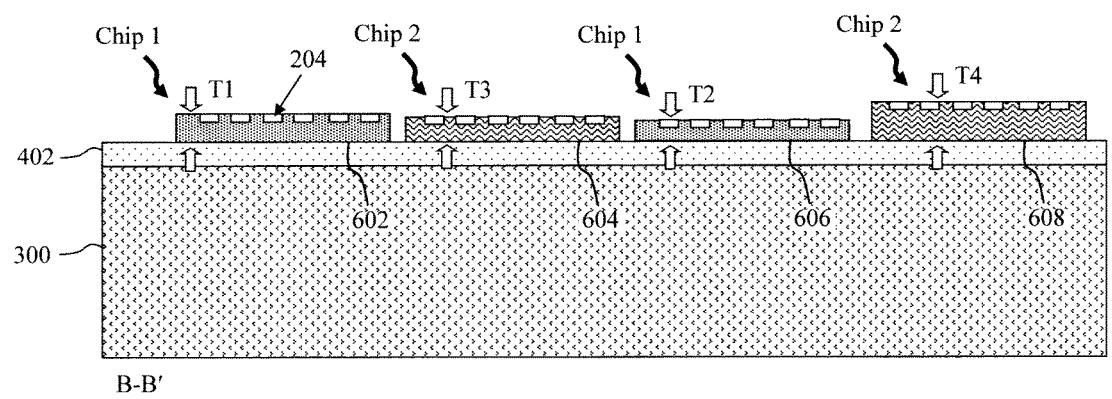
FIG. 6 is a cross-sectional diagram illustrating the chips have varying thicknesses according to an embodiment of the present invention.

As shown in FIG. 6, the chips have varying thicknesses. FIG. 6 provides a cross-sectional view through substrate 300 and the chips (Chip 1 and Chip 2) along line B-B' (see FIG. 5). This variation in thickness can be by design (i.e., different chips, multiple chips within a common package, etc. are produced having different dimensions including thickness) and/or due to process variations.

Regarding process variations, as shown in FIG. 6 instances of the same type of chip (Chip 1 or Chip 2) can have differences in thickness. For instance, in the present example, a first Chip 1 (given reference numeral 602) has a thickness T1 and a second Chip 1 (given reference numeral 606) has a thickness T2, wherein T1>T2. Likewise, a first Chip 2 (given reference numeral 604) has a thickness T3 and a second Chip 2 (given reference numeral 608) has a thickness T4, wherein T3<T4. Further, in this example, T4>T1>T3>T2. These thickness dimensions will be referenced later to describe the process of pressing the chips into the base film 402 to create a coplanar surface across the top surfaces of the chips.

As shown in FIG. 6, the as-placed chips sit on top of the base film 402 which, due to the thickness variations amongst the chips, creates a non-coplanar surface across the top surfaces of the chips. For instance, the thickest chip/chip 608 has the highest top surface above base film 402, followed by chip 602, and so on. Thus, the as-placed chips will produce a non-planar surface on top of the substrate. Trying to form BEOL metal wiring to these chips at various heights above the base film 402 would be extremely difficult, if at all possible.

Figure 7:
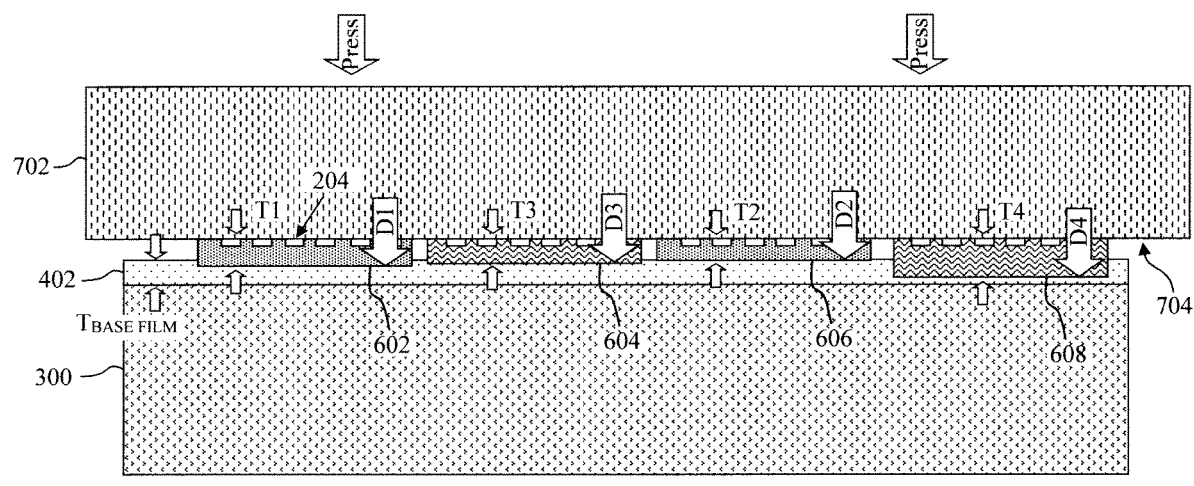
FIG. 7 is a cross-sectional diagram illustrating a presser device having been used to press the chips into the base film in order to level out the various chip heights such that top surfaces of the chips are coplanar, after which the base film is cured according to an embodiment of the present invention.

Thus, a presser device 702 is next used to press the chips into the base film 402 in order to level out the various chip heights. See FIG. 7. FIG. 7 provides a cross-sectional view through substrate 300 and the chips (Chip 1 and Chip 2) along line B-B' (see FIG. 5). Namely, as shown in FIG. 7, the presser device 702 includes a flat, planar surface 704 at the interface with the chips. In the present example, planar surface 704 spans all of the chips 602-608 on substrate 300. Since this planar surface applies force across the tops of multiple chips, the thicker chips will be pressed further into the base film 402 than the thinner chips. For instance, as provided above, chips 602, 604, 606 and 608 have thicknesses T1, T3, T2 and T4, respectively, wherein T4>T1>T3>T2. Accordingly, chips 602, 604, 606 and 608 are pressed to a depth D1, D3, D2 and D4, respectively, into the base film 402, wherein D4>D1>D3>D2. In order to achieve a co-planar surface across the tops of the chips, a downward force is applied at least until the presser device 702 contacts the top of the thinnest chip. However, the pressing can continue beyond that point in order to sink the chips further into the base film, if so desired.

Exemplary thickness values for the base film 402 were provided above. However, the thickness of the base film 402 essentially depends on the thickness differences amongst the chips. To look at it another way, in order to achieve a co-planar surface across the tops of the chips, the base film 402 has to be at least as thick as the thickness difference between the thickest chip and the thinnest chip. Namely, the base film 402 has a thickness $T_{BASE}$ FILM that is greater than or equal to the thickness of the chip having the greatest thickness less the thickness of the chip having the smallest thickness. To use the example provided in FIG. 7 as an illustration, chip 608 has the greatest thickness T4 amongst the chips, and chip 606 has the smallest thickness T2 amongst the chips. In that case, the thickness of the base film 402 $T_{BASE\ FILM} \geq T4-T2$. That way, the thickest chip can be pressed into the base film by an amount T4-T2 before the presser device 702 contacts the thinnest chip.

Following the pressing of the chips into the base film 402, the base film 402 is cured. As provided above, the curing will crosslink the base film, thereby setting the (co-planar) positioning of the chips on the substrate. According to an exemplary embodiment, the curing of the base film 402 is carried out by annealing the substrate 300/base film 402 at a temperature of from about 100° C. to about 500° C. and ranges therebetween, for a duration of from about 1 hour to about 5 hours and ranges therebetween.

Figure 8:
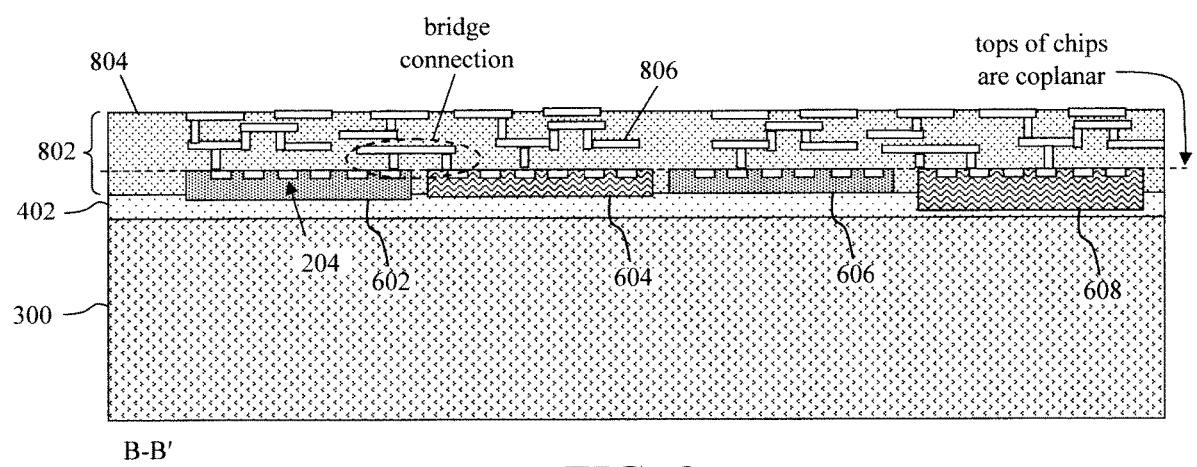
FIG. 8 is a cross-sectional diagram illustrating an interconnect layer with back-end of line (BEOL) metal wiring having been formed on the substrate over the base film and chips according to an embodiment of the present invention.

An interconnect layer 802 is then formed on the substrate 300 over the base film 402 and chips. See FIG. 8. FIG. 8 provides a cross-sectional view through substrate 300 and the chips (Chip 1 and Chip 2) along line B-B' (see FIG. 5). As shown in FIG. 8, interconnect layer 802 includes a dielectric 804 deposited onto the substrate 300 over the base film 402 and the chips, and BEOL metal wiring 806 formed in a dielectric 804.

Suitable dielectric 804 materials include, but are not limited to, oxide low-K materials such as silicon oxide (SiOx) and/or oxide ultralow-K interlayer dielectric (ULK-ILD) materials, e.g., having a dielectric constant K of less than 2.7. By comparison, silicon dioxide ($SiO_2$) has a dielectric constant K value of 3.9. Suitable ultralow-K dielectric materials include, but are not limited to, porous organosilicate glass (pSiCOH). A process such as chemical vapor deposition (CVD), atomic layer deposition (ALD), or physical vapor deposition (PVD) can be used to deposit the dielectric 804, after which the dielectric 804 can be planarized using a process such as chemical mechanical polishing (CMP). It is notable that, while dielectric 804 is depicted as a single layer, dielectric 804 can include multiple layers optionally formed from different dielectric materials.

Like metal landing pads 204, the BEOL metal wiring 806 can be formed in the dielectric 804 using a damascene or dual damascene process, whereby a feature (damascene process) or a combination of features (dual damascene process) such as a trench and/or a via are first patterned in dielectric 804. The feature(s) are then filled with a contact metal such as Cu, Co, Ru and/or W. A process such as evaporation, sputtering or electrochemical plating can be employed to deposit the contact metal into the features. Prior to depositing the contact metal, the feature(s) can be lined with a diffusion barrier layer (not shown). As provided above, suitable materials for the diffusion barrier layer include, but are not limited to, Ti, Ta, TiN and/or TaN.

As shown in FIG. 8, the BEOL metal wiring 806 contacts the metal landing pads 204 on the tops of the chips. As also shown in FIG. 8, the metal wiring can also provide bridge connections between chips.

Figure 9:
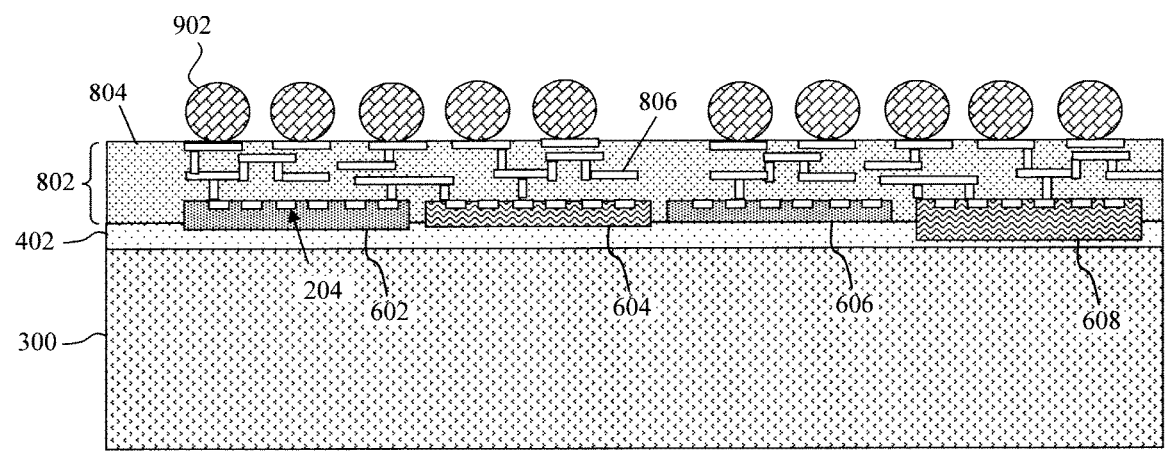
FIG. 9 is a cross-sectional diagram illustrating solder bumps having been formed on the interconnect layer in contact with the BEOL metal wiring according to an embodiment of the present invention.

As shown in FIG. 9, a C4 process can be employed to form solder bumps 902 on the interconnect layer 802 in contact with the BEOL metal wiring 806. FIG. 9 provides a cross-sectional view through substrate 300 and the chips (Chip 1 and Chip 2) along line B-B' (see FIG. 5). The resulting structure, i.e., substrate with chips set at different depths in the base film 402 and the interconnect layer 802 over the chips having BEOL metal wiring 806, is what is referred to herein as an interposer-less multi-chip module.

Figure 10:
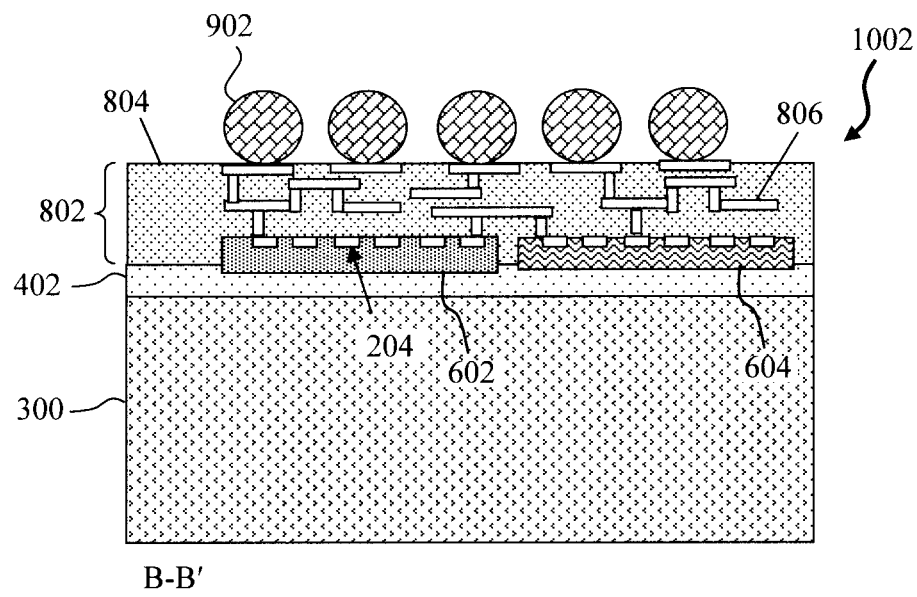
FIG. 10 is a cross-sectional diagram illustrating the substrate having been diced into multiple segments, each segment containing at least two of the chips according to an embodiment of the present invention.

Finally, as shown in FIG. 10, the substrate 300 can then be diced into multiple segments 1002. Each segment 1002 contains at least two of the chips. Standard wafer dicing techniques can be employed. As provided above, each segment 1002 individually serves as an interposer-less multi-chip module on-chip interposer for the chips that it contains.

Figure 11:
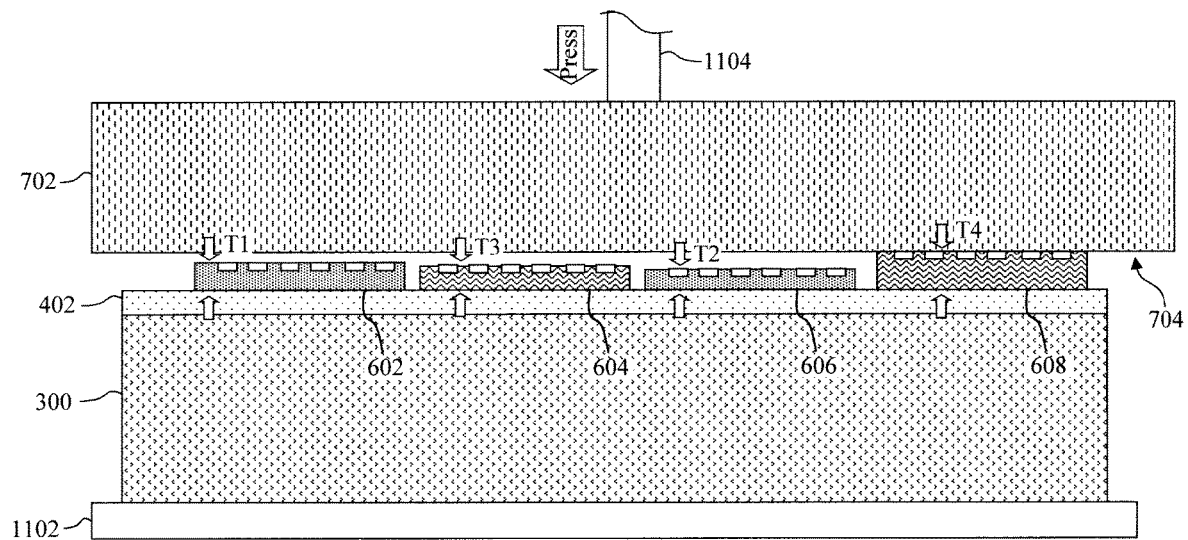
FIG. 11 is a cross-sectional diagram illustrating the substrate with the chips placed thereon over the base film having been disposed on a fixed position stage, and the presser device having been brought down towards the stage to first contact the chip with the greatest thickness according to an embodiment of the present invention.

The action of the presser device 702 is now further illustrated by way of reference to FIGS. 11-14. Like structures with those above will be numbered alike. As shown in FIG. 11, the substrate 300 having chips 602-608 placed thereon over base film 402 is disposed on a fixed position stage 1102. Namely, the position of stage 1102 remains fixed while the position of the presser device 702 moves towards (or away from) the stage 1102. According to an exemplary embodiment, a post 1104 connects the presser device 702 to a mechanical press (not shown) that actuates the presser device 702 down/up towards/away from stage 1102.

As the presser device 702 is brought down towards the stage 1102 the planar surface 704 of the presser device 702 will first contact chip 608 which has the greatest thickness T4 amongst the chips. See FIG. 11. Namely, as provided above, chips 602, 604, 606 and 608 have thicknesses T1, T3, T2 and T4, respectively, wherein T4>T1>T3>T2.

Figure 12:
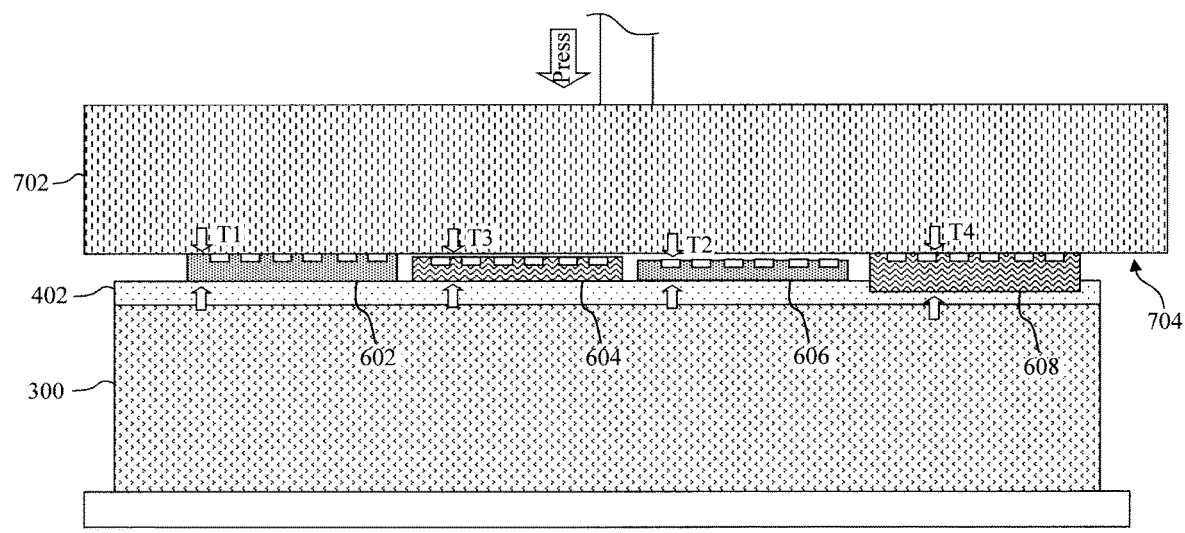
FIG. 12 is a cross-sectional diagram illustrating the presser device having been brought down closer towards the stage to next contact the chip with the second greatest thickness according to an embodiment of the present invention.

As the presser device 702 is brought down closer towards the stage 1102, the planar surface 704 of the presser device 702 will next contact chip 602 which has the second greatest thickness T1 amongst the chips. See FIG. 12. As shown in FIG. 12, this action of bringing the presser device 702 in contact with chip 602 will press chip 608 into the base film 402.

Figure 13:
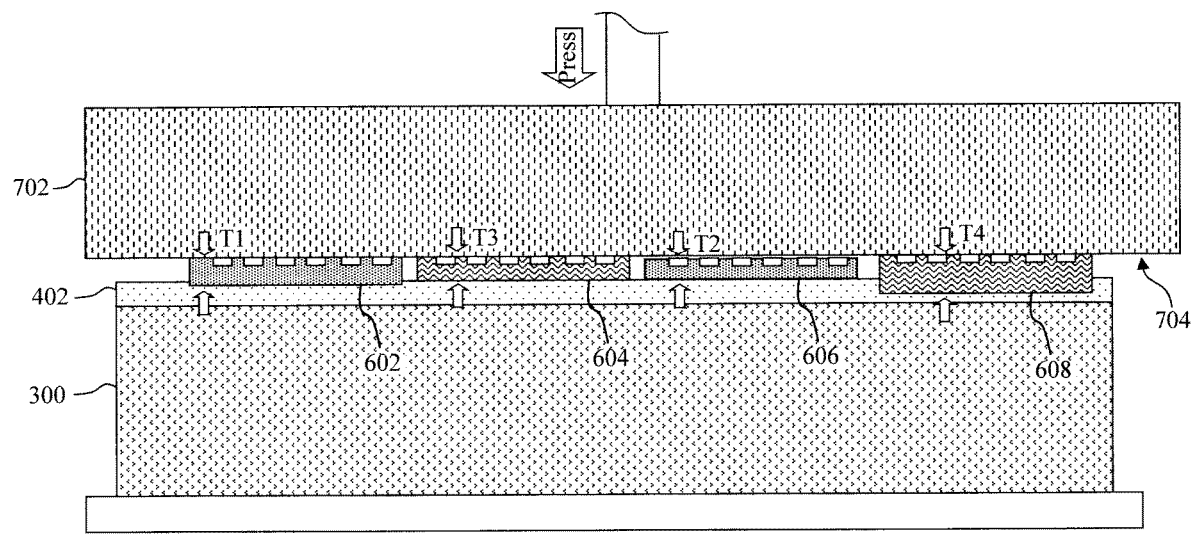
FIG. 13 is a cross-sectional diagram illustrating the presser device having been brought down even closer towards the stage to next contact the chip with the third greatest thickness according to an embodiment of the present invention.

Continuing to bring the presser device 702 down closer towards the stage 1102, the planar surface 704 of the presser device 702 will next come in contact with chip 604 which has the third greatest thickness T3 amongst the chips. See FIG. 13. As shown in FIG. 13, this action of bringing the presser device 702 in contact with chip 604 will press chip 602 into the base film, and press chip 608 further into the base film 402.

Figure 14:
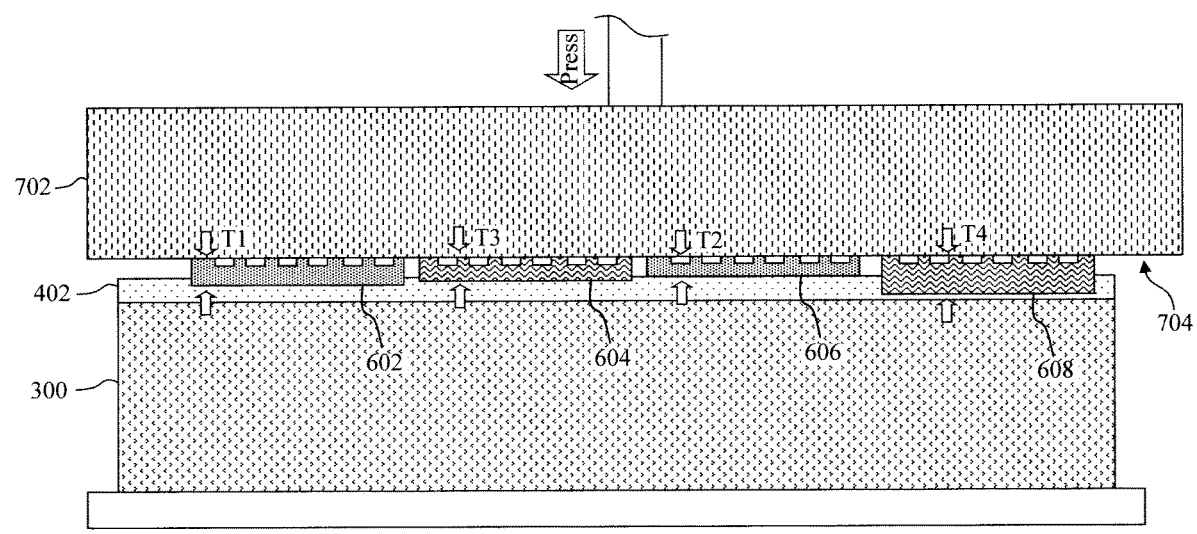
FIG. 14 is a cross-sectional diagram illustrating the presser device having been brought down yet even closer towards the stage to next contact the chip with the smallest thickness according to an embodiment of the present invention.

Lowering the presser device 702 further towards the stage 1102, the planar surface 704 of the presser device 702 will finally come in contact with chip 606 which has the smallest thickness T2 amongst the chips. See FIG. 14. As shown in FIG. 14, this action of bringing the presser device 702 in contact with chip 606 will press chip 604 into the base film, and press chips 602 and 608 further into the base film 402.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interposer-less multi-chip module, comprising:
   a substrate;
   a base film disposed on the substrate; and
   chips pressed into the base film, wherein the chips have varying thicknesses, and wherein top surfaces of the chips are coplanar.

2. The interposer-less multi-chip module of claim 1, wherein the base film comprises a material selected from the group consisting of: spin-on-glass, a doped polymer, and combinations thereof.

3. The interposer-less multi-chip module of claim 1, wherein the base film is cross-linked.

4. The interposer-less multi-chip module of claim 1, wherein the substrate comprises a silicon (Si) wafer.

5. The interposer-less multi-chip module of claim 1, wherein the chips comprise upward facing metal landing pads.

6. An interposer-less multi-chip module, comprising:
a substrate;
a base film disposed on the substrate;
chips pressed into the base film, wherein the chips have varying thicknesses, and wherein the chips are pressed into the base film to different depths such that top surfaces of the chips are coplanar; and
an interconnect layer present on the substrate over the chips, wherein the interconnect layer comprises back-end-of line (BEOL) metal wiring.

7. The interposer-less multi-chip module of claim 6, wherein the base film comprises a material selected from the group consisting of: spin-on-glass, a doped polymer, and combinations thereof.

8. The interposer-less multi-chip module of claim 6, wherein the chips comprise upward facing metal landing pads, and wherein the BEOL metal wiring contacts the upward facing metal landing pads.

9. The interposer-less multi-chip module of claim 6, wherein the BEOL metal wiring provides bridge connections between the chips.

10. The interposer-less multi-chip module of claim 6, further comprising:
solder bumps present on the interconnect layer in contact with the metal wiring.

11. A method of forming an interposer-less multi-chip module, the method comprising:
depositing a base film onto a substrate;
placing chips on the substrate over the base film;
pressing the chips into the base film using a presser such that top surfaces of the chips are coplanar; and
curing the base film to cross-link the base film.

12. The method of claim 11, wherein the base film comprises a material selected from the group consisting of: spin-on-glass, a doped polymer, and combinations thereof.

13. The method of claim 11, wherein the presser comprises a planar surface spanning all of the chips.

14. The method of claim 11, wherein the chips have varying thicknesses.

15. The method of claim 11, wherein the chips comprise upward facing metal landing pads.

16. The method of claim 11, wherein curing the base film comprises annealing the substrate at a temperature of from about 100° C. to about 500° C. and ranges therebetween, for a duration of from about 1 hour to about 5 hours and ranges therebetween.

17. A method of forming an interposer-less multi-chip module, the method comprising:
depositing a base film onto a substrate;
placing chips on the substrate over the base film, wherein the chips have varying thicknesses;
pressing the chips into the base film using a presser, wherein the presser presses the chips having the varying thickness into the base film to different depths such that top surfaces of the chips are coplanar;
curing the base film; and
forming an interconnect layer on the substrate over the chips, wherein the interconnect layer comprises BEOL metal wiring.

18. The method of claim 17, wherein the base film comprises a material selected from the group consisting of: spin-on-glass, a doped polymer, and combinations thereof.

19. The method of claim 17, wherein the presser comprises a planar surface spanning all of the chips.

20. The method of claim 17, wherein the chips comprise upward facing metal landing pads, and wherein the BEOL metal wiring contacts the upward facing metal landing pads.

21. The method of claim 17, wherein the BEOL metal wiring provides bridge connections between the chips.

22. The method of claim 17, further comprising:
forming solder bumps on the interconnect layer in contact with the metal wiring.

23. The method of claim 17, further comprising:
dicing the substrate into multiple segments, wherein each of the multiple segments comprises at least two of the chips.

* * * * *